(12) United States Patent
Ting

(10) Patent No.: US 8,520,427 B2
(45) Date of Patent: Aug. 27, 2013

(54) MEMORY CELL AND MEMORY ARRAY UTILIZING THE MEMORY CELL

(75) Inventor: Tah-Kang Joseph Ting, Hsinchu County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 93 days.

(21) Appl. No.: 13/365,274

(22) Filed: Feb. 3, 2012

(65) Prior Publication Data

US 2012/0213028 A1     Aug. 23, 2012

(30) Foreign Application Priority Data

Feb. 17, 2011   (EP) ..................................... 11154812

(51) Int. Cl.
*G11C 11/24* (2006.01)

(52) U.S. Cl.
USPC ................................ 365/149; 365/63; 365/51

(58) Field of Classification Search
USPC .................................. 365/149, 63, 51, 189.11
See application file for complete search history.

(56) References Cited

U.S. PATENT DOCUMENTS

| 8,009,459 B2 * | 8/2011 | Wu et al. .................. 365/149 |
| 2003/0062905 A1 | 4/2003 | Kollmer |
| 2003/0151943 A1 | 8/2003 | Sadakata |
| 2011/0002159 A1 | 1/2011 | Suzuki |

OTHER PUBLICATIONS

Chun, ISSCC/Session 28/DRAM & High-Speed I/O/28.10, Feb. 23, 2011.

* cited by examiner

*Primary Examiner* — David Lam
(74) *Attorney, Agent, or Firm* — Winston Hsu; Scott Margo

(57) ABSTRACT

A memory cell comprising a first switch device, a second switch device and a capacitor is disclosed. The first switch device has: a control terminal coupled to a select line, wherein the first switch device is controlled by the select line; a first terminal, coupled to a bit line parallel with the select line. The second switch device has: a first terminal, coupled to the second terminal of the first switch device; a control terminal, coupled to a word line orthogonal to the bit line and the select line, wherein the second switch device is controlled by the word line. The capacitor has a first terminal coupled to the second terminal of the second switch device and a second terminal coupled to a predetermined voltage level, wherein the data is read from the capacitor or written to the capacitor via the bit line.

10 Claims, 6 Drawing Sheets

MEMORY CELL AND MEMORY ARRAY UTILIZING THE MEMORY CELL

BACKGROUND OF THE INVENTION

1. Field of the Invention

The present invention relates to a memory cell and a memory array utilizing the memory cell, and particularly relates to the structure of a memory cell and a memory array.

2. Description of the Prior Art

A conventional DRAM cell includes a bit line, a word line, a switch device (always be a transistor) and a capacitor. The capacitor is utilized to store data when it is charged or discharged (logic value 0 or 1). The switch device is turned on or off via a word line. The bit line is utilized to transmit the data read from the capacitor of the memory cell, or the data written to the capacitor, when the switch device to the memory cell is turned on.

With the advancement of semiconductor processing technologies, the size of semiconductor devices is shrinking. Accordingly, the sizes of DRAM cells are also becoming smaller, thus significantly reducing the distances between bit lines. As a result, adjacent bit lines may suffer undesirable coupling effect and generate noise to each other. As a result, data transmitted by bit lines in such a device may therefore be wrongly determined. For example, data 0 may be wrongly determined to be 1, and data 1 may be wrongly determined to be 0.

SUMMARY OF THE INVENTION

One objective of the present invention is providing a memory cell and a memory array utilizing the memory cell, which can downsize the circuit area and avoid the coupling effect issue.

One objective of the present invention is to provide a memory array that can avoid the disturbance that the bit lines cause to each other, and the memory cell included in the memory array.

One embodiment of the present invention discloses a memory cell, which comprises a first switch device, a second switch device and a capacitor. The first switch device has: a control terminal coupled to a select line, wherein the first switch device is controlled by the select line to be turned on or turned off; a first terminal, coupled to a bit line parallel with the select line; and a second terminal. The second switch device has: a first terminal, coupled to the second terminal of the first switch device; a control terminal, coupled to a word line orthogonal to the bit line and the select line, wherein the second switch device is controlled by the word line to be turned on or turned off; and a second terminal. The capacitor has a first terminal coupled to the second terminal of the second switch device and a second terminal coupled to a predetermined voltage level, wherein the data is read from the capacitor or written to the capacitor via the bit line.

Another embodiment of the present invention discloses a memory array comprising a plurality of memory cells. Each of the memory cells comprises a first switch device, a second switch device and a capacitor. The first switch device has: a control terminal coupled to a column select line, wherein the first switch device is controlled by the column select line to be turned on or turned off; a first terminal, coupled to a bit line parallel with the column select line; and a second terminal. The second switch device has: a first terminal, coupled to the second terminal of the first switch device; a control terminal coupled to a word line orthogonal to the bit line and the column select line, wherein the second switch device is controlled by the word line to be turned on or turned off; and a second terminal. The capacitor has a first terminal coupled to the second terminal of the second switch device and a second terminal coupled to a predetermined voltage level, wherein the data is read from the capacitor or written to the capacitor via the bit line.

These objectives of the present invention will no doubt become obvious to those of ordinary skill in the art after reading the following detailed description of the preferred embodiment that is illustrated in the various figures and drawings.

DETAILED DESCRIPTION

Certain terminologies are used throughout the description and following claims to refer to particular components. As one skilled in the art will appreciate, electronic equipment manufacturers may refer to a component by different terms. This document does not intend to distinguish between components that differ in terms but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections. Please note that a DRAM is utilized for explaining the following embodiments. The following embodiments are, nevertheless, applicable to other types of memory devices.

Figure 1:
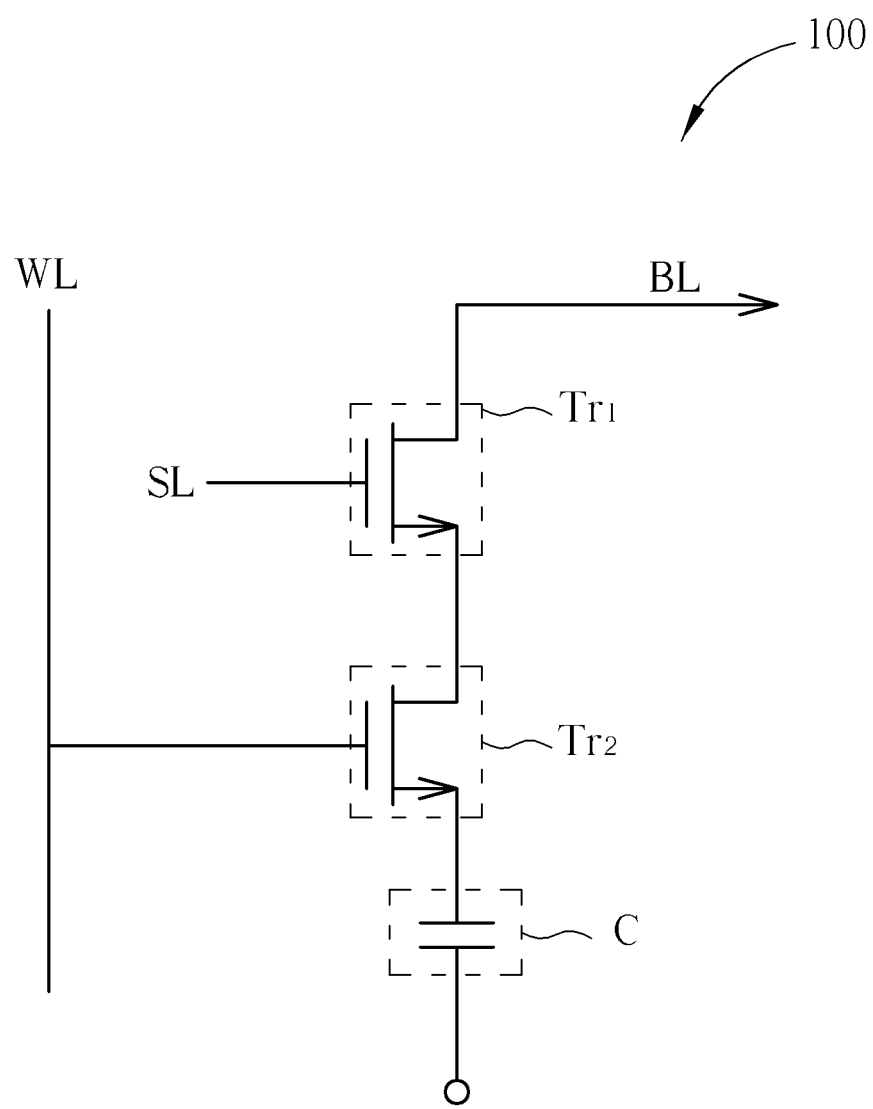
FIG. 1 is a circuit diagram illustrating a memory cell according to one exemplary embodiment of the present invention.

Please refer to FIG. 1, which is a circuit diagram illustrating a memory cell 100 according to an exemplary embodiment of the present invention. As shown in FIG. 1, the memory cell 100 includes a first switch device $Tr_1$, a second switch device $Tr_2$ and a capacitor C coupled in series between a bit line BL and a predetermined voltage level. The first switch device $Tr_1$ includes a control terminal coupled to a select line SL. The first switch device $Tr_1$ is turned on or off according to the potential of the select line SL. A first terminal of the first switch device $Tr_1$ is coupled to a bit line BL.

The second switch device $Tr_2$ includes a control terminal coupled to a word line WL, and is turned on or off according to the potential of the word line WL. A first terminal of the second switch device $Tr_2$ is coupled to a second terminal of the first switch device $Tr_1$ (in this embodiment, they are directly connected). The capacitor C includes a first terminal coupled to a second terminal of the second switch device $Tr_2$, and a second terminal coupled to a predetermined voltage level. The capacitor C is for storing data, and the data is read from the capacitor C or written to the capacitor C via the bit line BL when both the first switch device $Tr_1$ and the second switch device $Tr_2$ are turned on. Please note that the embodiment shown in FIG. 1 of the present invention includes an important physical structure feature: the bit line BL is parallel with the select line SL. Also, the word line WL is orthogonal to the bit line BL and the select line SL.

A conventional DRAM memory cell has only the second switch device $Tr_2$ and the capacitor C. When the second switch device $Tr_2$ is turned on, the bit line BL is electronically connected to the capacitor C and can transmit data to the capacitor C or read data from the capacitor C. If, however, the memory cell further includes the first switch device $Tr_1$ as is shown in the present invention, the bit line BL will transmit no data and remain silent when the first switch device $Tr_1$ is turned off, even if the second switch device $Tr_2$ is turned on. To make the connection between bit line BL and the capacitor C, the first switch device $Tr_1$ must also be turned on.

Also, transistors such as NMOSFETs can be implemented as switch devices $Tr_1$ and $Tr_2$. In this case, first terminals of the first and the second switch devices $Tr_1$ and $Tr_2$ are drain terminals, control terminals of the first and the second switch devices $Tr_1$ and $Tr_2$ are gate terminals, and the second terminals of the first and the second switch devices $Tr_1$ and $Tr_2$ are source terminals. Please note that this example is not intended to limit the scope of the present invention. For example, other devices that can be utilized as switch devices, such as PMOSFETs or BJTs, can also be the switch devices $Tr_1$ and $Tr_2$.

FIGS. 2-5 are schematic diagrams illustrating an exemplary semiconductor structure and manufacturing process thereof for the circuit diagram depicted in FIG. 1. Please note that the process and the semiconductor structure shown in FIGS. 2-5 are only for example and do not mean to limit that the memory cell shown in FIG. 1 can only be manufactured based on the semiconductor structures and processes in FIGS. 2-5.

One exemplary process for manufacturing the semiconductor structure is explained as below. Please note that the process shown in FIG. 2-FIG. 5 focus on the processes for manufacturing the bit lines BL, the select lines SL and the word lines WL. The processes for manufacturing other devices such as transistors are omitted for brevity here, since they are known by persons skilled in the art.

Figure 2:
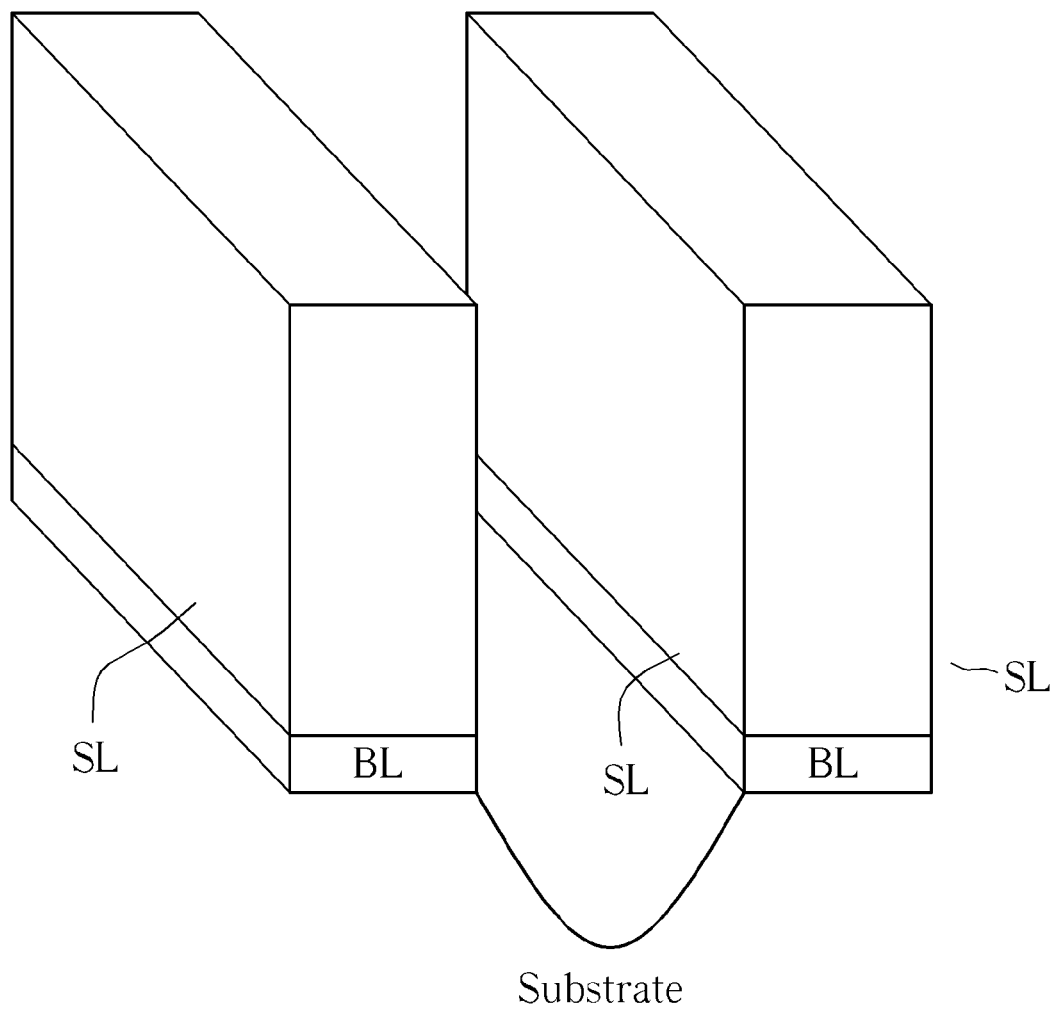
FIG. 2-FIG. 5 are schematic diagrams illustrating an exemplary semiconductor structure and manufacturing process thereof for the circuit diagram depicted in FIG. 1.

In FIG. 2, the bit line BL is formed, which can include the steps of: bit line lithography, bit line etching, implanting, annealing and isolation etching. For example, during BL formation, an oxide film and a nitride film are grown on the entire surface of a silicon substrate (not illustrated). Then, the nitride film is patterned in conformity with switch devices forming portions. Using the patterned nitride film as a mask, etching is carried out to form silicon lines. Then, the silicon lines are subjected to side-surface oxidation and formed with a nitride film and then, by entire-surface etch back, a sidewall is formed. Thereafter, arsenic (As), phosphorus (P), or the like is implanted at the root of the silicon lines and follow by anneal to form a buried diffusion layer which will serve as bit lines BL.

Figure 3:
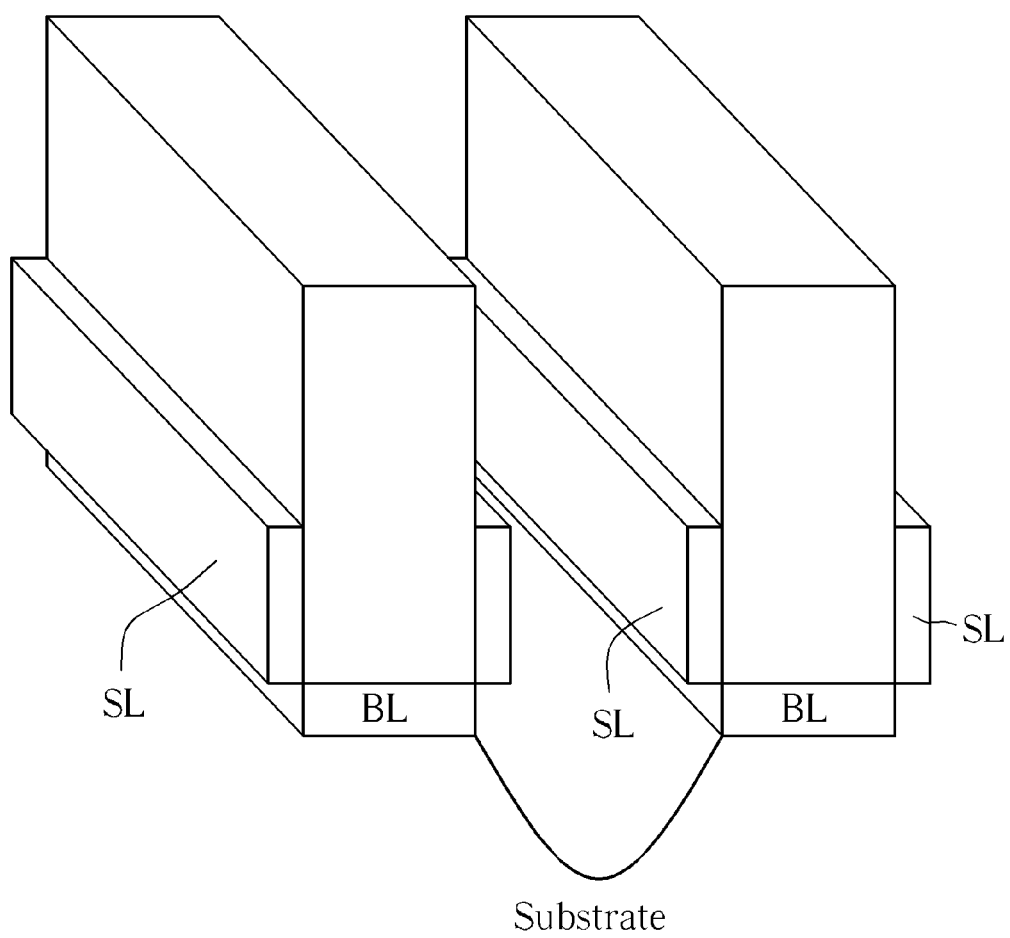

In FIG. 3, the select line SL is formed, which can include the steps of oxide filling, recessing, gate oxide providing, metal liner producing, dry etching, oxide filling again and CMP. For example, during SL formation, the sidewall nitride film is removed by oxide film etching and nitride film etching. Oxide refill and recess to define bottom height of SL. Gate insulating films and gate electrodes are formed and subjected to etch back, thereby forming the select lines SL to first switch device $Tr_1$ on lower side surfaces of the silicon pillars in the same direction of the buried bit lines BL. Please note isolation material can be provided (not illustrated here) between the select lines SL and the bit lines BL to prevent these two devices from touching each other.

Figure 4:
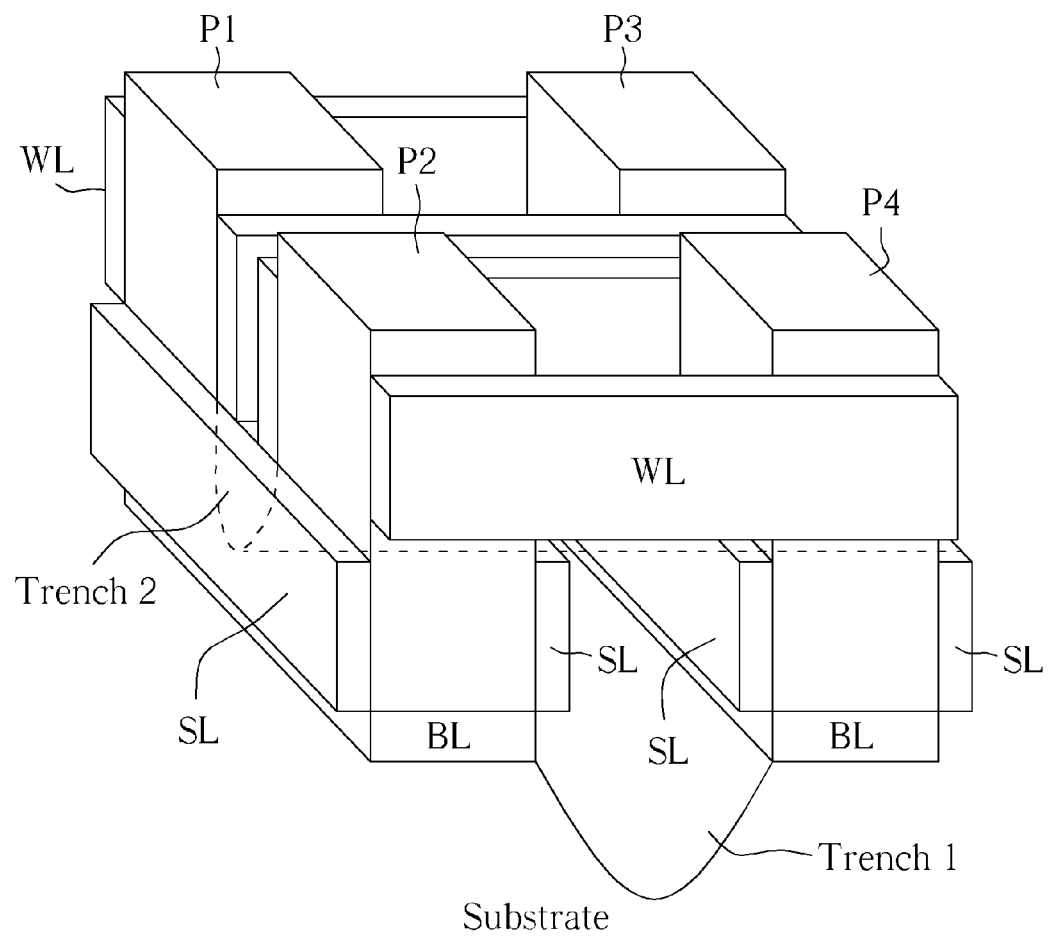

In FIG. 4, the word line WL is formed, which may includes the steps of: word line lithography, word line etching, gate oxide providing, and metal liner producing. For example, during the WL formation, WL lithography and an etching process may be used to form Silicon pillars, followed by gate oxide formation. Metal liner deposition on the entire wafer and etch back can then be used to remove top and bottom metal liners. Next a WL sidewall is formed. Thereafter, arsenic (As), phosphorus (P), or the like is implanted and then word lines WL to second switch device $Tr_2$ are formed on upper side surfaces of the silicon pillars in a direction perpendicular to the buried bit lines BL. The silicon pillars P1, P2, P3, P4, in FIG. 4 are generated from the structure shown in FIG. 3 via etching. Therefore a Trench 2 indicated by dotted lines is formed between the silicon pillars P1, P2 and between the silicon pillars P3 and P4. If it is looked from the left side of FIG. 4, the shape of Trench 2 looks like which of Trench 1 formed on the substrate.

Figure 5:
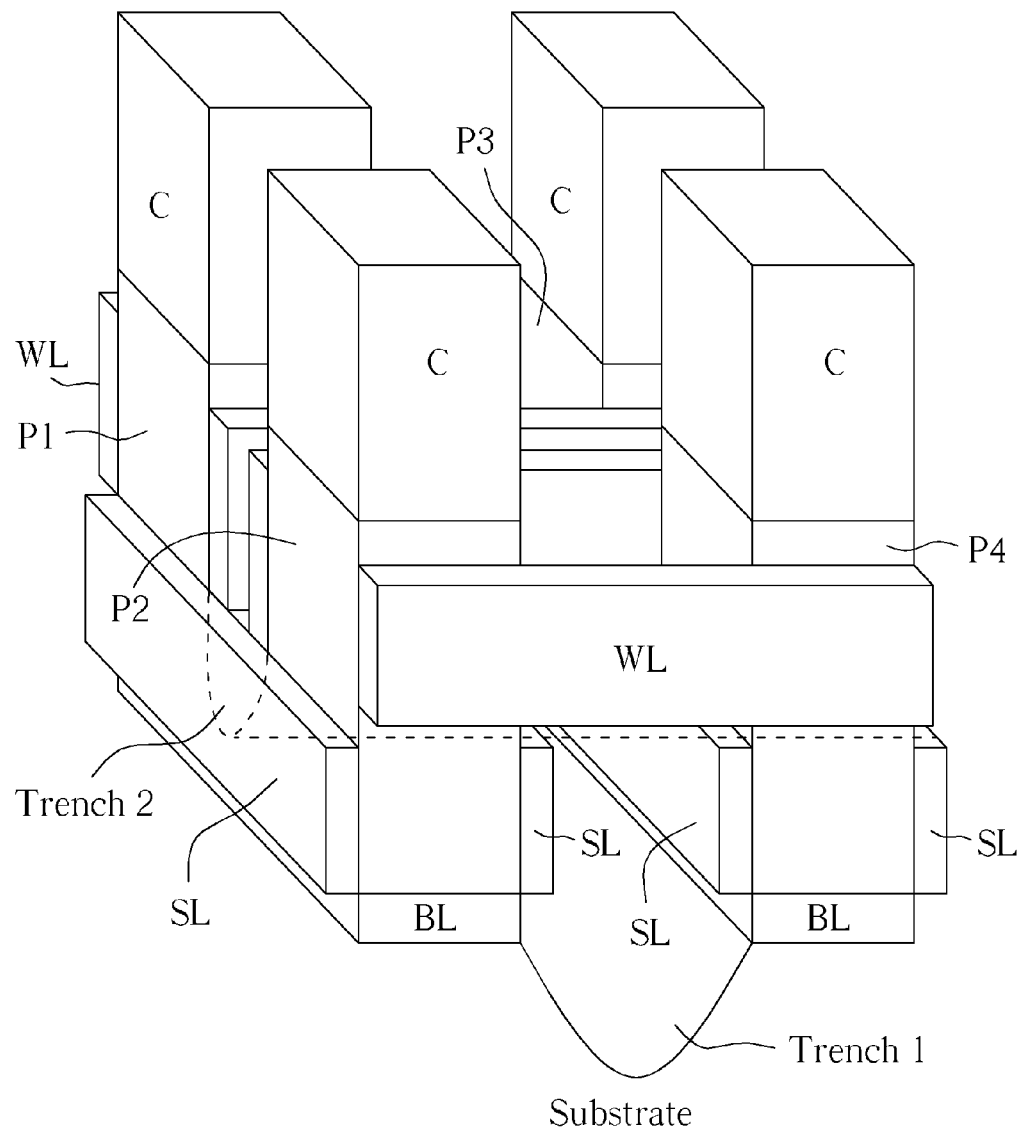

In FIG. 5, the capacitor C is formed, an interlayer oxide film is formed up to the top of the silicon pillars and then the nitride film on the silicon pillars is removed. Then, arsenic (As), phosphorus (P), or the like is implanted to form an N+ diffusion layer. Thereafter, capacitor contacts for capacitor connection and capacitors C are formed.

Via the brief steps disclosed in FIG. 2-FIG. 5, the word line, the bit line BL, and the select line SL can be formed. Please note many details or substitute steps are not illustrated here, persons skilled in the art can understand that the semiconductor and the manufacturing process that can be implemented to the memory cell shown in FIG. 1 are not limited to what disclosed in FIG. 2-FIG. 5.

Figure 6:
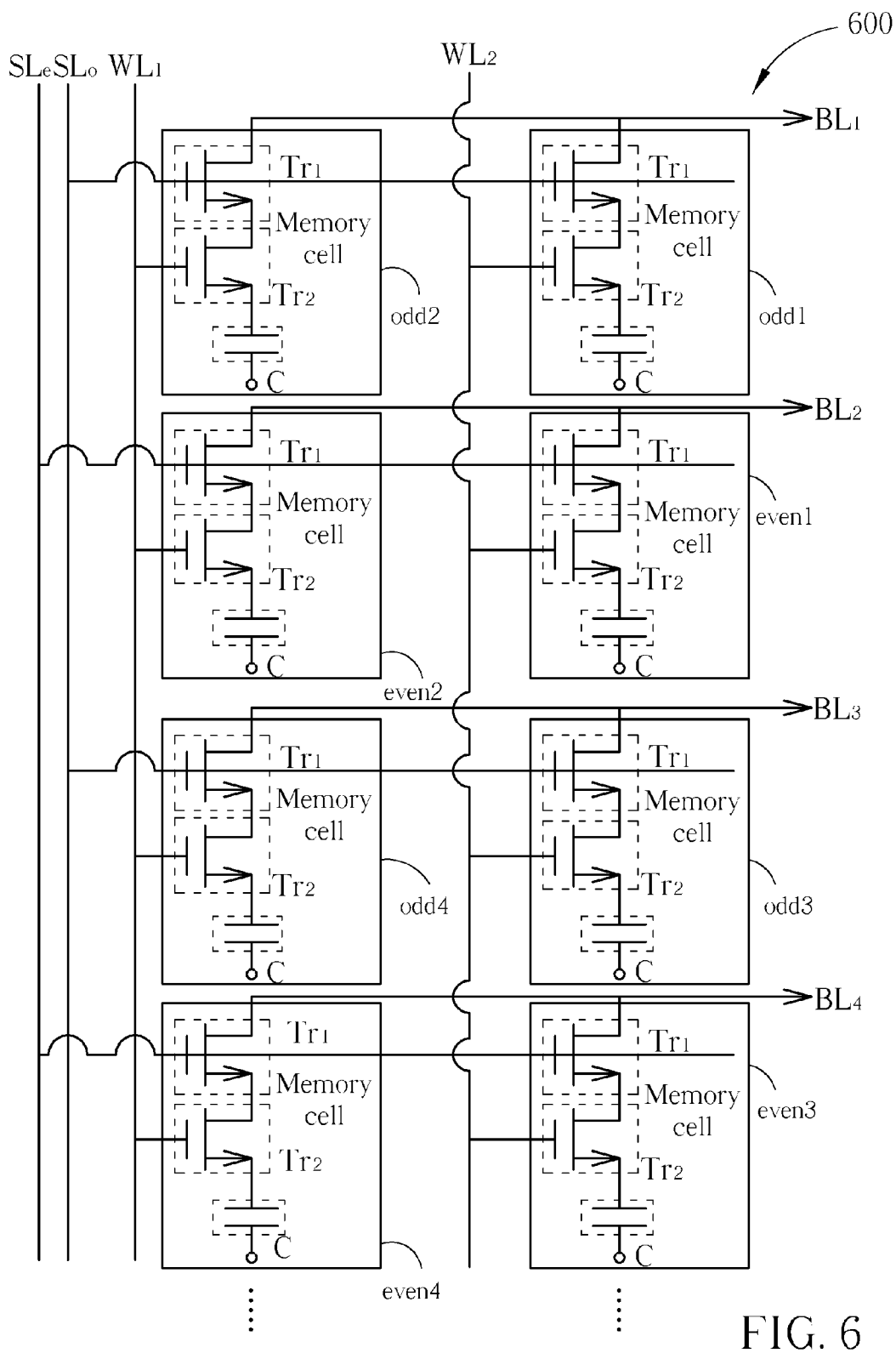
FIG. 6 is a circuit diagram illustrating a memory array according to one exemplary embodiment of the present invention.

Please refer to FIG. 6, which illustrates a memory array 600 utilizing memory cells illustrated in FIG. 1, according to one embodiment of the present invention. As shown in FIG. 6, the memory array 600 includes a plurality of memory cells $odd_1$-$odd_4$, and $even_1$-$even_4$. Each of the memory cells $odd_1$-$odd_4$, $even_1$-$even_4$ includes a first switch device $Tr_1$, a second switch device $Tr_2$ and a capacitor C, as in the memory cell shown in FIG. 1. Also, please note that the memory array according to the present invention has one feature: the memory cell is provided at each intersection of the bit lines and word lines. In one embodiment, the memory cells $odd_1$-$odd_4$, and $even_1$-$even_4$ can be classified into odd memory cells ($odd_1$, $odd_2$, $odd_3$, $odd_4$) and even memory cells ($even_1$, $even_2$, $even_3$, $even_4$). Please note the column select lines $SL_o$, $SL_e$ are the select line SL in FIG. 1, but are named column select lines and classified into odd select lines $SL_o$ and $SL_e$ in this embodiment) The column select lines $SL_o$, $SL_e$ respectively serve to control the first switch devices $Tr_1$ in the odd memory cells and the even memory cells. The odd memory cells $odd_1$, $odd_2$, $odd_3$, $odd_4$ are controlled by the column select line $SL_o$ and the word lines $WL_1$, $WL_2$. Also, the even memory cells $even_1$, $even_2$, $even_3$ and $even_4$ are controlled by the column select line $SL_e$, and the word lines $WL_1$, $WL_2$.

In one embodiment, when the bit lines $BL_1$, $BL_3$ of the odd memory cells $odd_1$, $odd_2$, $odd_3$, $odd_4$ are transmitting data, the first switch devices $Tr_1$ in the even memory cells $even_1$, $even_2$, $even_3$, $even_4$ are controlled by the column select line $SL_e$ to be turned off, such that the bit lines $BL_2$, $BL_4$ of the even memory cells $even_1$, $even_2$, $even_3$, $even_4$ cease transmitting data and keep silent. Similarly, when the bit lines $BL_2$, $BL_4$ of the even memory cells $even_1$, $even_2$, $even_3$, $even_4$ are transmitting data (ex. in a sensing stage), the first switch devices $Tr_1$ in the odd memory cells $odd_1$, $odd_2$, $odd_3$ and $odd_4$ are controlled by the column select line $SL_o$ to be turned off, such that the bit lines $BL_1$, $BL_3$ cease transmitting data and keep silent.

In this way, the bit line that ceases transmitting data can be utilized as shielding for the bit line that transmits data, thus the two or more bit lines transmitting data can be prevented from disturbing to each other since there is a shielding located between two active bit lines.

In view of the above mentioned embodiment shown in FIG. 6, the memory array according to the present invention can be summarized as follows:

The memory cells in the memory array can be classified into a first group of memory cells and a second group of memory cells, and the bit lines of the memory array are arranged in a way that no adjacent bit lines are from the same group of memory cells. In this arrangement, the memory operation can be designed such that when the bit lines of one of the two groups of memory cells are transmitting data, the bit lines of the other group of memory cells are not transmitting data. In this way, the noise coupling effect between bit lines is minimized.

It should be noted that the structure shown in FIG. 6 does not mean to limit the scope of the present application. For example, the memory cells in the memory array can be classified into more than two groups. Furthermore, the operation of the memory array is not limited to be the same as above-mentioned operation.

In view of above-mentioned embodiments, the memory cell according to present invention can downsize the circuit region since it has a 3D structure. Also, the noise coupling effect between two adjacent bit lines can be minimized. Besides, the memory cells disclosed in the present invention can be utilized for folded bit lines.

Those skilled in the art will readily observe that numerous modifications and alterations of the device and method may be made while retaining the teachings of the invention.

What is claimed is:

1. A memory cell, comprising:
   a first switch device, having:
      a control terminal coupled to a select line, wherein the first switch device is controlled by the select line to be turned on or turned off;
      a first terminal, coupled to a bit line parallel with the select line; and
      a second terminal;
   a second switch device, having:
      a first terminal, coupled to the second terminal of the first switch device;
      a control terminal, coupled to a word line orthogonal to the bit line and the select line, wherein the second switch device is controlled by the word line to be turned on or turned off; and
      a second terminal; and
   a capacitor, having a first terminal coupled to the second terminal of the second switch device and a second terminal coupled to a predetermined voltage level, wherein the data is read from the capacitor or written to the capacitor via the bit line.

2. The memory cell of claim 1, wherein the second terminal of the first switch device is directly connected to the first terminal of the second switch device.

3. The memory cell of claim 1, wherein the first switch device and the second switch device are NMOSFETs, where the first terminals of the first switch device and the second switch device are drain terminals, the control terminals of the first switch device and the second switch device are gate terminals, and the second terminals of the first switch device and the second switch device are source terminals.

4. The memory cell of claim 1, wherein the first switch device and the second switch device are PMOSFETs, where the first terminals of the first switch device and the second switch device are source terminals, the control terminals of the first switch device and the second switch device are gate terminals, and the second terminals of the first switch device and the second switch device are drain terminals.

5. A memory array, comprising:
   a plurality of memory cells, wherein each of the memory cells comprises:
      a first switch device, having:
         a control terminal coupled to a column select line, wherein the first switch device is controlled by the column select line to be turned on or turned off;
         a first terminal, coupled to a bit line parallel with the column select line; and
         a second terminal;
      a second switch device, having:
         a first terminal, coupled to the second terminal of the first switch device;
         a control terminal coupled to a word line orthogonal to the bit line and the column select line, wherein the second switch device is controlled by the word line to be turned on or turned off; and
         a second terminal; and
      a capacitor, having a first terminal coupled to the second terminal of the second switch device and a second terminal coupled to a predetermined voltage level, wherein the data is read from the capacitor or written to the capacitor via the bit line.

6. The memory array of claim 5, wherein the memory cells in the memory array can be classified into multiple groups of memory cells, and the bit lines of the memory array are arranged in a way that no adjacent bit lines are from the same group of memory cells, when the bit lines of one of the multiple groups of memory cells are transmitting data, the bit lines of the other groups of memory cells are not transmitting data.

7. The memory array of claim 5, wherein the second terminal of the first switch device is directly connected to the first terminal of the second switch device.

8. The memory array of claim 5, wherein the first switch device and the second switch device are NMOSFETs, where the first terminals of the first switch device and the second switch device are drain terminals, the control terminals of the first switch device and the second switch are gate terminals, and the second terminals of the first switch device and the second switch device are source terminals.

9. The memory array of claim 5, wherein the first switch device and the second switch device are PMOSFETs, where the first terminals of the first switch device and the second switch device are source terminals, the control terminals of the first switch device and the second switch are gate terminals, and the second terminals of the first switch device and the second switch device are drain terminals.

10. The memory array of claim 5, wherein the memory cell is provided at each intersection of the bit lines and the word lines.

* * * * *